(12) United States Patent
Matsuda et al.

(10) Patent No.: US 10,765,000 B2
(45) Date of Patent: Sep. 1, 2020

(54) METHOD FOR MANUFACTURING MULTILAYER PRINTED CIRCUIT BOARD

(71) Applicant: NIPPON MEKTRON, LTD., Tokyo (JP)

(72) Inventors: Fumihiko Matsuda, Tokyo (JP); Shoji Takano, Tokyo (JP)

(73) Assignee: NIPPON MEKTRON, LTD., Tokyo (JP)

(*) Notice: Subject to any disclaimer, the term of this patent is extended or adjusted under 35 U.S.C. 154(b) by 0 days.

(21) Appl. No.: 16/446,031

(22) Filed: Jun. 19, 2019

(65) Prior Publication Data
US 2020/0037443 A1 Jan. 30, 2020

(30) Foreign Application Priority Data
Jul. 25, 2018 (JP) .................. 2018-139780

(51) Int. Cl.
| H05K 3/20 | (2006.01) |
| H05K 1/02 | (2006.01) |
| H05K 1/11 | (2006.01) |
| H05K 3/40 | (2006.01) |
| H05K 3/46 | (2006.01) |
| B32B 38/10 | (2006.01) |

(52) U.S. Cl.
CPC .......... *H05K 1/0298* (2013.01); *B32B 38/10* (2013.01); *H05K 1/115* (2013.01); *H05K 3/4038* (2013.01); *H05K 3/46* (2013.01); *Y10T 29/49128* (2015.01)

(58) Field of Classification Search
CPC .... H05K 1/0298; H05K 1/115; H05K 3/4038; H05K 3/46; B32B 38/10; Y10T 29/49126; Y10T 29/49128; Y10T 29/49155
USPC ................... 29/830, 831, 846, 852
See application file for complete search history.

(56) References Cited

U.S. PATENT DOCUMENTS

| 4,872,934 A | 10/1989 | Kameda |
| 5,731,227 A * | 3/1998 | Thomas ............ H01L 23/49827 29/846 |
| 6,090,468 A * | 7/2000 | Shimada ............. H01L 21/4857 29/825 |

(Continued)

FOREIGN PATENT DOCUMENTS

| JP | 2631287 B2 | 7/1997 |
| JP | 2007-096121 A | 4/2007 |

(Continued)

*Primary Examiner* — Donghai D Nguyen
(74) *Attorney, Agent, or Firm* — Studebaker & Brackett PC

(57) ABSTRACT

A method for manufacturing a multilayer printed circuit board includes: preparing a first wiring substrate having a first insulating resin film having a first circuit pattern formed on a first main surface, and a first protective film releasably bonded to a second main surface; partially removing the first protective film and the first insulating resin film to form a bottomed via hole having the first circuit pattern exposed on a bottom surface; filling the bottomed via hole with a conductive paste; disposing a second protective film on the first protective film to cover the bottomed via hole filled with the conductive paste; removing an unnecessary portion of the first wiring substrate after the second protective film is disposed on the first protective film; and peeling off the first protective film and the second protective film from the first wiring substrate after the unnecessary portion is removed.

11 Claims, 8 Drawing Sheets

(56) References Cited

U.S. PATENT DOCUMENTS

| | | | |
|---|---|---|---|
| 6,440,542 B1 * | 8/2002 | Kariya | ............... H05K 3/0035 174/259 |
| 2016/0095227 A1 | 3/2016 | Takano et al. | |
| 2016/0295707 A1 | 10/2016 | Takano et al. | |

FOREIGN PATENT DOCUMENTS

| | | |
|---|---|---|
| JP | 2011-066293 A | 3/2011 |
| JP | 2015-061058 A | 3/2015 |
| JP | 2015-095562 A | 5/2015 |

* cited by examiner

METHOD FOR MANUFACTURING MULTILAYER PRINTED CIRCUIT BOARD

CROSS-REFERENCE TO RELATED APPLICATION

This application claims priority from Japanese Patent Application No. 2018-139780 filed with the Japan Patent Office on Jul. 25, 2018, the entire content of which is hereby incorporated by reference.

BACKGROUND

1. Technical Field

The present disclosure relates to a method for manufacturing a multilayer printed circuit board and the multilayer printed circuit board.

2. Related Art

Demand for higher density of printed circuit boards is increased associated with progress of miniaturization and high functionality of electronic devices. In order to meet the demand, the multilayer printed circuit board has been developed. Further, as part of the higher density, Japanese Patent No. 2631287 describes a hybrid multi-layered circuit substrate. The hybrid multi-layered circuit substrate has two rigid multi-layered circuit substrates and a flexible printed circuit board connecting the multi-layered circuit substrates. These printed circuit boards are widely used mainly for portable communication terminals such as a smart phone, and small electronic devices such as a notebook computer, a digital camera, and a game machine.

In recent years, an amount of information handled by the electronic devices has been rapidly increasing. Therefore, a transmission rate of signals in the electronic devices tends to increase more and more. In the case of personal computers, the transmission rate shifts to 6 Gbps transmission standard from 2010 to 2011. And, it is also planned that the transmission rate shifts to the 10 Gbps standard in 2013. Under such circumstances, it is becoming more and more important to consider signal loss (transmission loss) in a transmission line.

In the case of the flexible printed circuit board, an insulating resin film having a low dielectric constant and a dielectric loss tangent (tan δ) has been studied to reduce transmission loss. And, a liquid crystal polymer (LCP) is used as a material of the insulating resin film. However, the insulating resin film made of the liquid crystal polymer has a thermal expansion coefficient in a thickness direction larger than that of a conventional film made of insulating material such as polyimide. Therefore, when a plating through-hole generally used conventionally is applied to an interlayer connection path of the multilayer printed circuit board, a difference of the thermal expansion coefficient between the liquid crystal polymer and the plating through-hole is large. Therefore, there is a possibility that interlayer connection reliability cannot be sufficiently ensured for a temperature cycle and the like.

Therefore, it has been proposed to form the interlayer connection path using a conductive paste obtained by mixing conductive particles (such as copper particles or silver particles) with a resin binder such as epoxy. For example, JP-A-2011-066293 and JP-A-2007-096121 describe the flexible printed circuit board having an insulating resin film made of the liquid crystal polymer as an insulating base substrate, and a conductive via formed of conductive paste as the interlayer connection path.

Further, JP-A-2015-061058 describes a method for manufacturing a printed circuit board having the conductive via. According to the method, a wiring substrate is manufactured as follows. First, an adhesive insulating resin film is attached to a metal-clad laminate. Then, the conductive paste is filled in a bottomed via hole formed by laser processing. Thereafter, a part of the conductive paste protrudes from the insulating base substrate by peeling off the insulating resin film. Thereafter, the two wiring substrates are stacked so that protruding portions of the conductive paste contact each other.

SUMMARY

A method for manufacturing a multilayer printed circuit board according to an embodiment of the present disclosure includes: S1) preparing a first wiring substrate having a first insulating resin film having a first main surface and a second main surface opposite to the first main surface, a first circuit pattern formed on the first main surface, and a first protective film releasably bonded to the second main surface; S2) partially removing the first protective film and the first insulating resin film to form a bottomed via hole having the first circuit pattern exposed on a bottom surface; S3) filling the bottomed via hole with a conductive paste; S4) disposing a second protective film on the first protective film to cover the bottomed via hole filled with the conductive paste; S5) removing an unnecessary portion of the first wiring substrate after the second protective film is disposed on the first protective film: S6) peeling off the first protective film and the second protective film from the first wiring substrate after the unnecessary portion is removed; S7) preparing a second wiring substrate having a second insulating resin film having a third main surface and a fourth main surface opposite to the third main surface, and a second circuit pattern formed on the third main surface; and S8) aligning and laminating the first wiring substrate after the first protective film and the second protective film are peeled off, on the second wiring substrate so that the second main surface and the third main surface face each other, a part of the second circuit pattern is exposed, and the conductive paste contacts the second circuit pattern.

DETAILED DESCRIPTION

Figure 1:
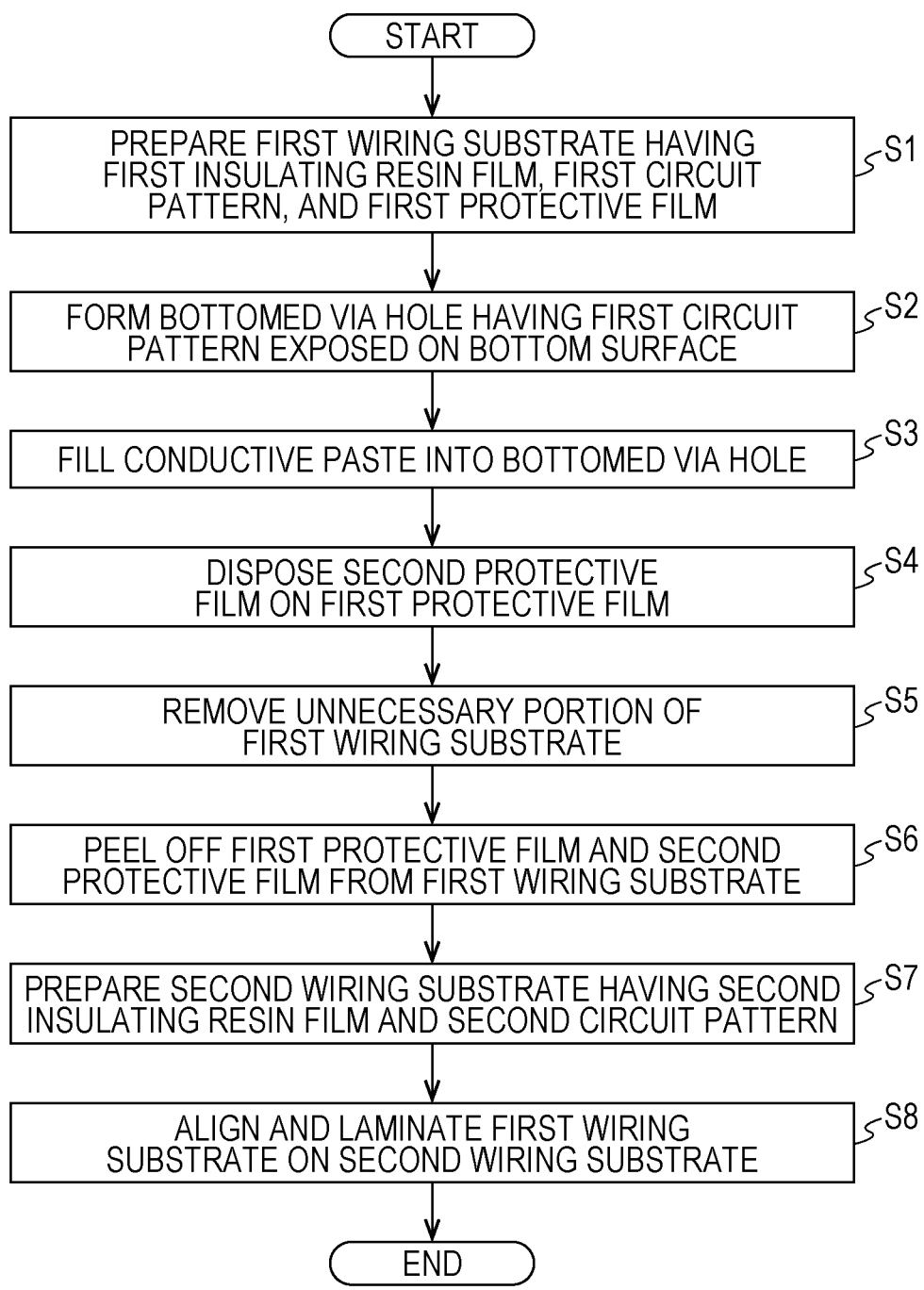
FIG. 1 is a flowchart showing a method for manufacturing a multilayer printed circuit board according to the present embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

By the way, there is a demand to more freely connect a flexible printed circuit board capable of transmitting high-speed signals to an electronic component, a printed circuit board or the like. For this purpose, it is necessary to provide an inner layer terminal, in which a part of an inner layer circuit pattern is exposed, to a multilayer flexible printed circuit board. In fact, a multilayer printed circuit board having an interlayer connection path formed by a conductive via formed using a conductive paste, and a part of the inner layer circuit pattern exposed to the outside as the inner layer terminal, and a method for manufacturing the same have been known. The following two methods can be considered as a method for forming such an inner layer terminal.

A first method is a method of removing an unnecessary portion by laser processing after laminating two wiring substrates. In this method, an insulating substrate is removed by irradiation with laser light. Thus, a part of the inner layer circuit pattern is exposed. However, as an area of the unnecessary portion is increased, productivity is reduced. If the area of the unnecessary portion is large, the productivity is extremely reduced. Another problem is that smear generated by the laser processing adheres to the printed circuit board.

A second method is a method of removing the unnecessary portion of one wiring substrate with a blade or the like before laminating two wiring substrates. According to this method, the productivity is not reduced even if the area of the unnecessary portion is increased. However, when removing the unnecessary portion, the conductive paste filling a bottomed via hole may be damaged, and generation of contamination may reduce yield.

A method for manufacturing the multilayer printed circuit board according to an embodiment of the present disclosure has been made based on the above technical recognition. An object of the present disclosure is to provide a method capable of manufacturing the multilayer printed circuit board with high yield, the multilayer printed circuit board having the interlayer connection path formed by the conductive via formed using the conductive paste, and a part of the inner layer circuit pattern exposed to the outside as the inner layer terminal.

Another object of the present disclosure is to provide the printed circuit board capable of transmitting the high-speed signals as follows. With the printed circuit board, reliability of the interlayer connection path is ensured. At the same time, the printed circuit board can be connected to the electronic component, the printed circuit board or the like with a high degree of freedom.

A method for manufacturing a multilayer printed circuit board according to an embodiment of the present disclosure includes: S1) preparing a first wiring substrate having a first insulating resin film having a first main surface and a second main surface opposite to the first main surface, a first circuit pattern formed on the first main surface, and a first protective film releasably bonded to the second main surface; S2) partially removing the first protective film and the first insulating resin film to form a bottomed via hole having the first circuit pattern exposed on a bottom surface; S3) filling the bottomed via hole with a conductive paste; S4) disposing a second protective film on the first protective film to cover the bottomed via hole filled with the conductive paste; S5) removing an unnecessary portion of the first wiring substrate after the second protective film is disposed on the first protective film; S6) peeling off the first protective film and the second protective film from the first wiring substrate after the unnecessary portion is removed; S7) preparing a second wiring substrate having a second insulating resin film having a third main surface and a fourth main surface opposite to the third main surface, and a second circuit pattern formed on the third main surface; and S8) aligning and laminating the first wiring substrate after the first protective film and the second protective film are peeled off, on the second wiring substrate so that the second main surface and the third main surface face each other, a part of the second circuit pattern is exposed, and the conductive paste contacts the second circuit pattern.

A multilayer printed circuit board according to an embodiment of the present disclosure includes: a first insulating resin film having a first main surface and a second main surface opposite to the first main surface, and containing a liquid crystal polymer; a first circuit pattern formed on the first main surface: a second insulating resin film having a third main surface and a fourth main surface opposite to the third main surface, and containing the liquid crystal polymer; a second circuit pattern formed on the third main surface; and a conductive via penetrating the first insulating resin film and a cured adhesive layer in a thickness direction thereof and electrically connecting the first circuit pattern and the second circuit pattern. The second insulating resin film is laminated on the first insulating resin film via the cured adhesive layer so that the third main surface faces the second main surface, the first insulating resin film has a cut surface, and a part of the second circuit pattern is exposed as an inner layer terminal without being covered with the first insulating resin film.

In the method for manufacturing the multilayer printed circuit board according to the present embodiment, the second protective film is disposed on the first protective film to cover the bottomed via hole filled with the conductive paste. Thereafter, the unnecessary portion of the first wiring substrate is removed. Therefore, when removing the unnecessary portion, the conductive paste does not receive a damage.

Therefore, according to the present embodiment, the interlayer connection path is formed by the conductive via formed using the conductive paste. At the same time, a part of the inner layer circuit pattern is exposed to the outside as the inner layer terminal. Thus, the multilayer printed circuit board can be manufactured with a high yield.

In the multilayer printed circuit board according to the present embodiment, the liquid crystal polymer is contained in the insulating base substrate. Further, the conductive via formed using the conductive paste forms the interlayer connection path. Furthermore, the first insulating resin film has the cut surface. A shape of the cut surface does not change after the cut surface is formed. Thus, a part of the second circuit pattern is exposed as the inner layer terminal without being covered with the first insulating resin film.

Therefore, according to the present embodiment, it is possible to provide the printed circuit board capable of transmitting the high-speed signals, ensuring reliability of the interlayer connection path, and being connected to external parts or the like with a high degree of freedom.

The present embodiment will be described with reference to the drawings below. In the drawings, components having the same functions are denoted by the same reference numerals. Further, the drawings are schematic. A relationship between thickness and planar dimension, a ratio between layer thicknesses, and the like are different from an actual relationship and ratio.

<Method of Manufacturing Multilayer Printed Circuit Board>

The method for manufacturing the multilayer printed circuit board according to the embodiment will be described with reference to a flowchart of FIG. 1, perspective views of FIGS. 2 to 6, and partial cross-sectional views of FIGS. 7A to 12. FIGS. 7A to 11B are cross-sectional views of a portion taken along a line A-A' in FIGS. 2 to 6.

Figure 2:
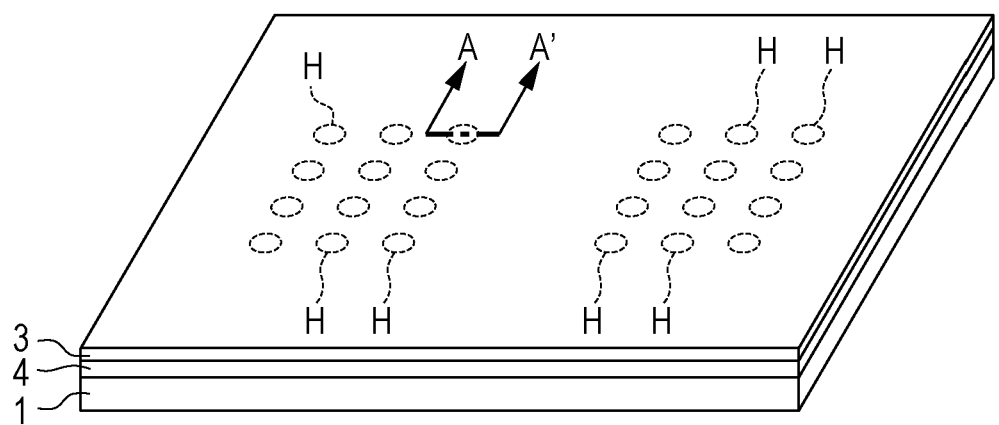
FIG. 2 is a perspective view for explaining the method for manufacturing the multilayer printed circuit board according to the present embodiment.

First, a wiring substrate 10 (first wiring substrate) shown in FIG. 2 is prepared (Step S1). The wiring substrate 10 has an insulating resin film 1 (first insulating resin film), a circuit pattern 2 (first circuit pattern), a protective film 3 (first protective film), and an adhesive layer 4. In FIG. 2, a symbol H shows a region (bottomed via hole formation planned region) where a bottomed via hole 5 described below will be formed.

The insulating resin film 1 is an insulating film made of the liquid crystal polymer (LCP). Its thickness is, for example, 100 μm. When a signal transmission rate of the printed circuit board is relatively low, the insulating resin film 1 may be formed of a known material (polyethylene terephthalate, polyimide or the like) used for the flexible printed circuit board.

Figure 7A:
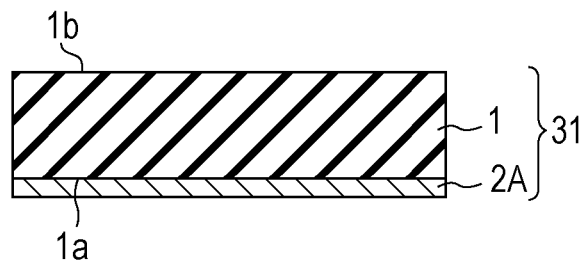
FIGS. 7A to 7C are partial cross-sectional views for explaining the method for manufacturing the multilayer printed circuit board according to the present embodiment.

As shown in FIG. 7A, the insulating resin film 1 has a main surface 1a (circuit pattern surface) and a main surface 1b (adhesive surface) opposite to the main surface 1a. In the present embodiment, the insulating resin film 1 is formed of a sheet of film. The insulating resin film 1 may be a multilayer film including laminated films. In this case, the insulating resin film 1 may have the inner layer circuit pattern.

The circuit pattern 2 is a wiring layer formed on the main surface 1a. The circuit pattern 2 is formed of a patterned copper foil in the present embodiment. However, the present disclosure is not limited thereto, but for example, the circuit pattern 2 may be formed of a conductive ink printed on the main surface 1a.

The protective film 3 is releasably bonded to the main surface 1b of the insulating resin film 1. In the present embodiment, as shown in FIG. 7C, the protective film 3 is releasably bonded to the adhesive layer 4 formed on the main surface 1b of the insulating resin film 1. The protective film 3 is made of, for example, PET. However, the protective film 3 may contain other materials.

The adhesive layer 4 is an adhesive layer formed on the main surface 1b of the insulating resin film 1. The protective film 3 is formed on the adhesive layer 4. An adhesion between the protective film 3 and the adhesive layer 4 is relatively weak and is such that the protective film 3 can be peeled off from the adhesive layer 4. As described above, in the present embodiment, the protective film 3 is releasably bonded to the main surface 1b of the insulating resin film 1 via the adhesive layer 4.

Here, the method for manufacturing the wiring substrate 10 will be described with reference to FIG. 7.

First, as shown in FIG. 7A, a single-sided metal-clad laminate 31 is prepared. The single-sided metal-clad laminate 31 has the above-described insulating resin film 1 and a metal foil 2A formed on the main surface 1a of the insulating resin film 1.

The metal foil 2A may be formed on the insulating resin film 1 via, for example, a treatment film including a Ni or Cr film. Or, the metal foil 2A may be bonded to the insulating resin film 1 with an adhesive.

The metal foil 2A is, for example, a copper foil. Its thickness is, for example, 12 μm. The metal foil 2A may contain a metal (such as silver or aluminum) other than copper.

Figure 7B:
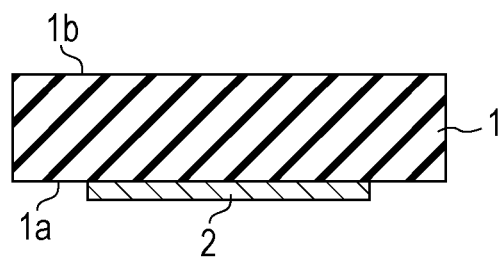
Figure 7C:
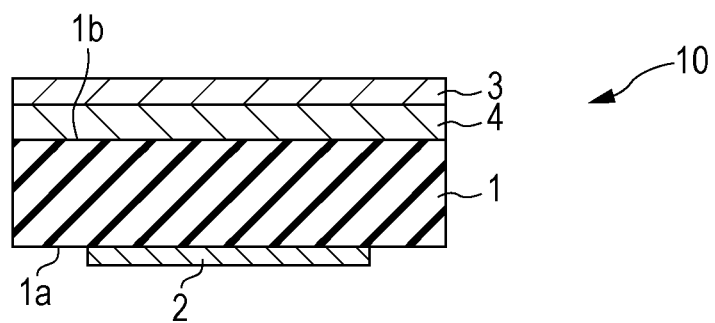

Next, as shown in FIG. 7B, the circuit pattern 2 is formed by patterning the metal foil 2A by a known photofabrication method.

Next, as shown in FIG. 7C, the adhesive layer 4 is bonded onto the main surface 1b of the insulating resin film 1. Thereafter, the protective film 3 is bonded to the adhesive layer 4. In the present embodiment, a low flow bonding sheet (for example, 15 μm thick) is bonded to the insulating resin film 1 as the adhesive layer 4. Lamination of the low flow bonding sheet is carried out at a temperature lower than a heat curing temperature so that required adhesion remains during an integration step described below. Thereafter, a PET film (for example, 15 μm thick) is bonded to the low flow bonding sheet as a protective film 3. A bonding step is performed under conditions of predetermined temperature and pressure (80° C. 2 MPa or the like) using, for example, a vacuum laminator.

The wiring substrate 10 is obtained through the above steps.

Here, instead of a method of sequentially bonding the adhesive layer 4 and the protective film 3 to the single-sided metal-clad laminate 31 as described above, a protective film with an adhesive layer having an adhesive layer formed on one side thereof may be bonded to the insulating resin film 1. Or, an adhesive protective film having a slightly adhesive layer (not shown) formed on one side thereof may be used as the protective film. Then, the adhesive protective film may be bonded to the main surface 1b of the single-sided metal-clad laminate 31. The adhesion of the slightly adhesive layer is weak to such an extent that the protective film can be peeled off from the insulating resin film 1. When using the adhesive protective film, the protective film according to the present embodiment can be regarded as being releasably bonded to the main surface of the insulating resin film without the adhesive layer interposed therebetween.

Note that patterning of the metal foil 2A may be performed after bonding the protective film 3.

Further, a circuit pattern (not shown) may be formed on the main surface 1b of the insulating resin film 1. In this case, the adhesive layer 4 is formed on the main surface 1b to embed the circuit pattern therein.

Figure 8A:
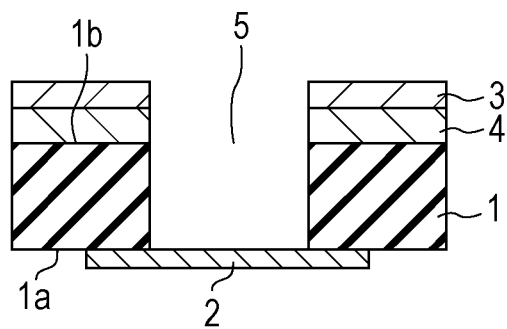
FIGS. 8A and 8B are partial cross-sectional views subsequent to FIGS. 7A to 7C for explaining the method for manufacturing the multilayer printed circuit board according to the present embodiment.

After preparing the wiring substrate 10, as shown in FIG. 8A, the bottomed via hole (conductive hole) 5 having the circuit pattern 2 exposed on a bottom surface thereof is formed (Step S2). In the present embodiment, the bottomed via hole 5 is formed by partially removing the protective film 3, the adhesive layer 4, and the insulating resin film 1. Specifically, perforation is performed by irradiating a bottomed via hole formation planned region H with laser light from the protective film 3 side. Thereafter, resin residue and the like present inside the hole are removed by desmear treatment. For example, a carbon dioxide gas laser is used as the laser. Further, diameter of the bottomed via hole 5 is, for example, φ150 μm to 200 μm.

Figure 3:
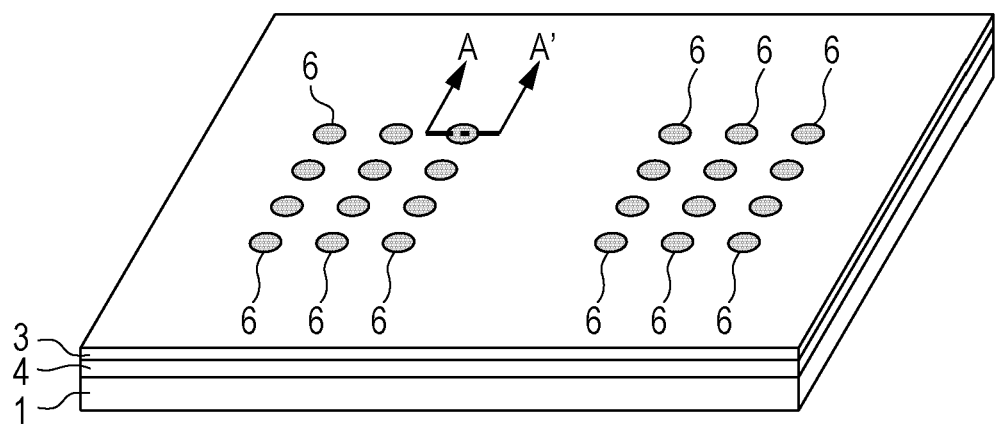
FIG. 3 is a perspective view subsequent to FIG. 2 for explaining the method for manufacturing the multilayer printed circuit board according to the present embodiment.
Figure 8B:
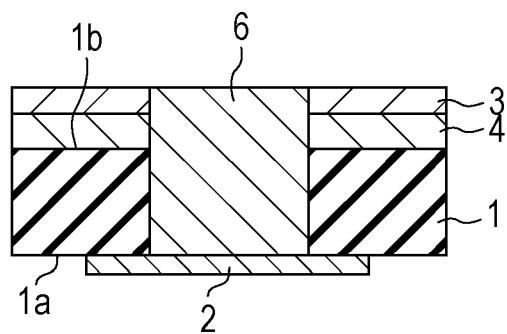

After the bottomed via hole 5 is formed, as shown in FIGS. 3 and 8B, the bottomed via hole 5 is filled with a conductive paste 6 (Step S3). In the present embodiment, the bottomed via hole 5 is filled with the conductive paste 6 using a printing method. In this case, the protective film 3 functions as a printing mask. The conductive paste is selectively printed in the bottomed via hole 5 by printing the conductive paste with a squeegee for screen printing under vacuum.

The conductive paste 6 preferably has a predetermined composition. Thus, metal particles in the conductive paste form metal bonds with each other at a process temperature or less in the integration step described below, and form metal bonds also with metal foils (copper foils or the like) contained in the circuit pattern 2. When the insulating resin film 1 is the liquid crystal polymer, the process temperature of the integration step is, for example, a temperature (about 200° C.) lower by 50° C. or more than a softening temperature of the liquid crystal polymer. The metal particles of the conductive paste form metal bonds with each other at 200° C. or less. Therefore, the conductive paste 6 preferably contains, for example, a low melting point metal or a low melting point alloy such as In, SnIn, or SnBi as contained in a low melting point solder. Further, the conductive paste 6 preferably contains an alloy containing, for example, at least one of metals including Sn, Zn, Al, Ag, Ni, and Cu in order to form an alloy layer and metal bonds with the circuit pattern 2 (copper foil).

In this step, printing is preferably performed with a vacuum printer for screen printing in order to avoid that an air void mixes in the printed conductive paste.

Further, the following method may be used instead of the method using the vacuum printer. In this method, the conductive paste is pressed into a conductive paste flow space formed by disposing a predetermined housing member on the protective film (see JP-A-2015-095562).

Figure 4:
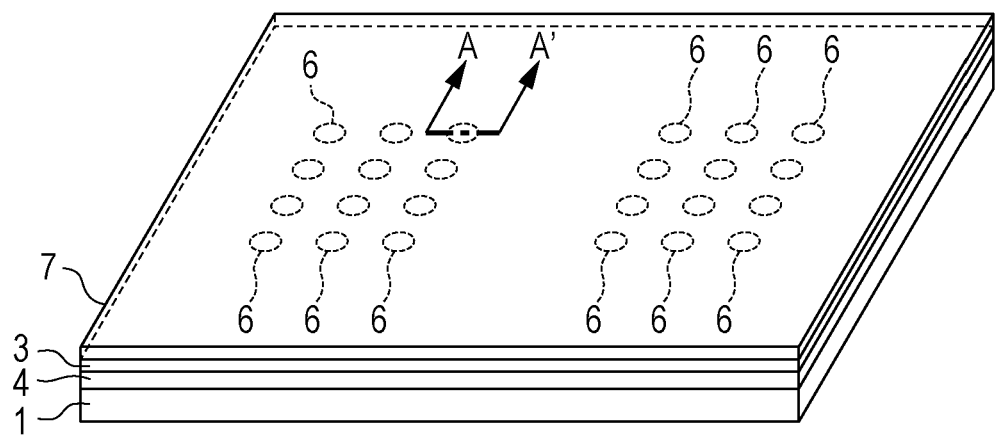
FIG. 4 is a perspective view subsequent to FIG. 3 for explaining the method for manufacturing the multilayer printed circuit board according to the present embodiment.
Figure 9A:
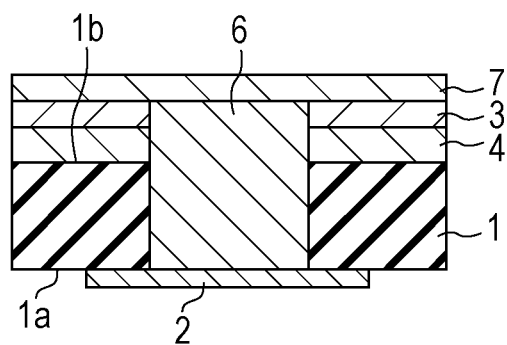
FIGS. 9A and 9B are partial cross-sectional views subsequent to 8A and 8B for explaining the method for manufacturing the multilayer printed circuit board according to the present embodiment.

After the bottomed via hole 5 is filled with the conductive paste 6, as shown in FIGS. 4 and 9A, a protective film 7 (the second protective film) is disposed on the protective film 3 (Step S4, protection step).

More specifically, the protective film 7 is disposed on the protective film 3 to cover the bottomed via hole 5 filled with the conductive paste 6. The protective film 7 made of PET is bonded to the protective film 3 under the conditions of predetermined temperature and pressure (80° C., 2 MPa or the like) using, for example, the vacuum laminator. The PET film is, for example, a film having a thickness of 25 μm which is easily available. However, the thickness is not particularly limited.

Note that the protective film 7 may contain materials other than PET. A material of the protective film 7 is preferably a material that does not cause problems such as reaction with the conductive paste 6. Further, when manufacturing the multilayer printed circuit board by a roll-to-roll method, the material that does not generate dust or the like during process flow is preferable.

As shown in FIG. 8B, the conductive paste 6 is printed up to almost the same height as a surface of the protective film 3. That is, the conductive paste 6 does not protrude from the surface of the protective film 3. Therefore, the conductive paste 6 is not damaged in the protection step.

In the case where the protective film 7 is simply placed on the protective film 3, the conductive film 6 may be damaged as the protective film 7 slides on the protective film 3. Therefore, the protective film 7 is preferably fixed so as not to slip on the protective film 3. In order to fix the protective film 7 to the protective film 3, for example, after bonding the protective film 7 to the protective film 3, the protective film 7 may be fused to the protective film 3 in a region outside a product portion. Or, the protective film 7 may be fixed by a tape or the like. Or, a film having an adhesive layer may be used as the protective film 7.

When the film having the adhesive layer is used as the protective film 7, the conductive paste 6 may adhere to the adhesive layer of the protective film 7 when the protective film 7 is peeled off in a later peeling step. Therefore, the protective film 7 preferably does not have the adhesive layer at least in a portion contacting the conductive paste 6.

In an example of FIG. 4, the protective film 7 is disposed to cover an entire surface of the protective film 3. However, arrangement of the protective film 7 is not limited thereto. That is, the protective film 7 may be disposed to cover at least the bottomed via hole 5 filled with the conductive paste 6. For example, only conductive via formation regions A1 and A2 of FIG. 5 may be covered with the protective film 7.

After the protective film 7 is disposed on the protective film 3 as described above, as shown in FIGS. 5 and 9B, an unnecessary portion P of the wiring substrate 10 is removed (Step S5, removal step). The conductive paste 6 is protected by the protective film 7. Therefore, the conductive paste 6 is not damaged in the removal step.

Figure 5:
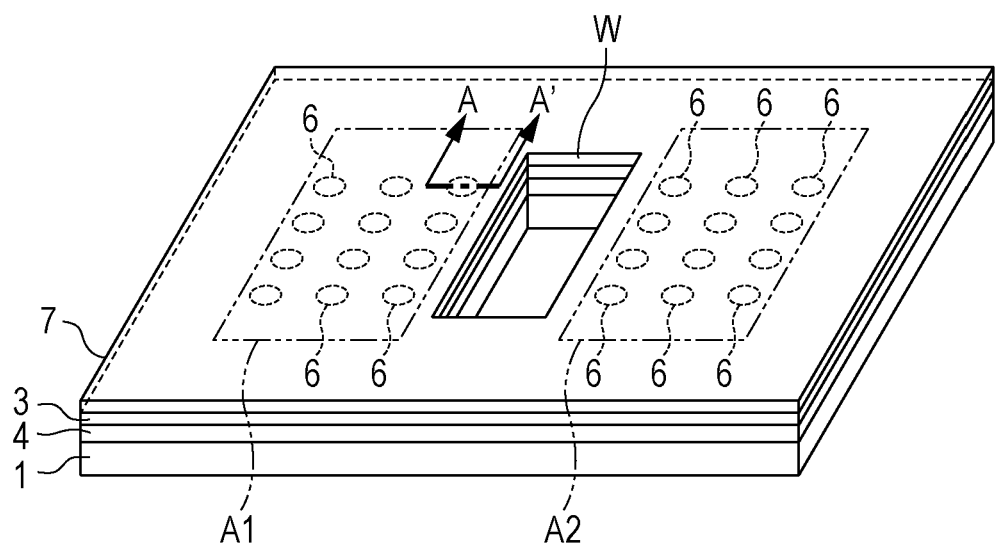
FIG. 5 is a perspective view subsequent to FIG. 4 for explaining the method for manufacturing the multilayer printed circuit board according to the present embodiment.
Figure 6:
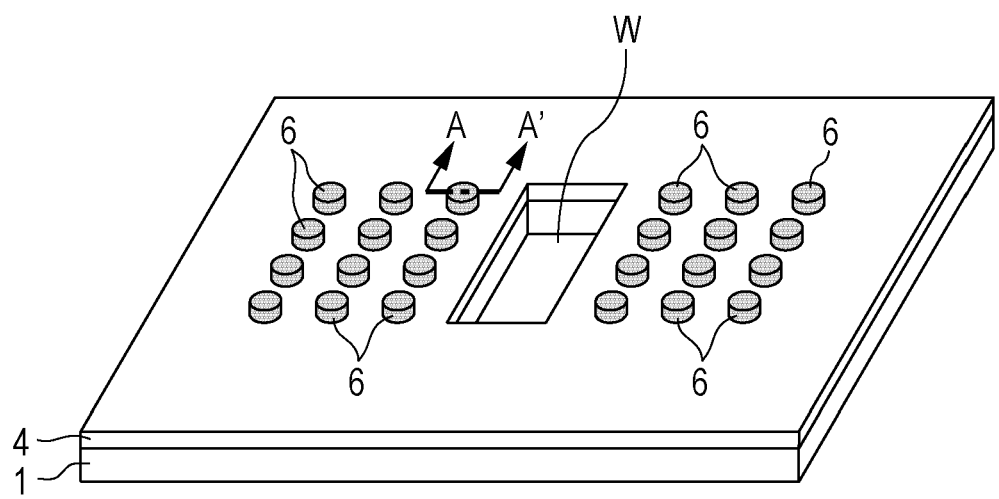
FIG. 6 is a perspective view subsequent to FIG. 5 for explaining the method for manufacturing the multilayer printed circuit board according to the present embodiment.

In the present embodiment, as shown in FIG. 5, a region sandwiched between the conductive via formation region A1 and the conductive via formation region A2 is removed. Thus, an opening W (window structure) penetrating the wiring substrate 10 in a thickness direction thereof is formed. More specifically, the opening W is formed by removing the region by punching. The conductive via formation regions A1 and A2 are regions including the conductive paste 6 filling bottomed via holes 5.

Figure 9B:
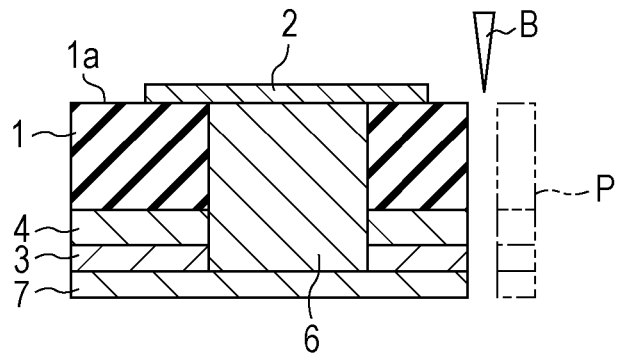

Further, in this embodiment, as shown in FIG. 9B, the unnecessary portion P is cut and removed with a blade B applied from the main surface 1a side. In this way, a cutting device (the blade, mold or the like) contacts the insulating resin film 1 left on a final product before the protective film 7 which is peeled and removed in the later step. Thus, processing quality of punching can be improved. Note that a laser device may be used as the cutting device.

In the removal step, the wiring substrate 10 having the protective film 7 fixed to the protective film 3 may be turned upside down so that the main surface 1a having faced downward faces upward. Thereafter, a camera (not shown) provided above the wiring substrate 10 may be used to recognize an image of the circuit pattern 2. In this case, alignment between the wiring substrate 10 and the cutting device can be performed based on image recognition results. Thus, the alignment can be performed with high accuracy. As a result, the unnecessary portion P can be removed with high accuracy.

Further, the cutting device such as the blade B applied to the main surface 1a from below the wiring substrate 10 may remove the unnecessary portion P without turning the wiring substrate 10 upside down (remaining in a state of FIG. 9A). Or, the cutting device applied to the protective film 7 may remove the unnecessary portion P.

Figure 10A:
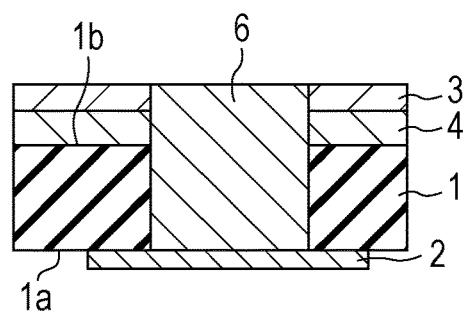
FIGS. 10A and 10B are partial cross-sectional views subsequent to 9A and 9B for explaining the method for manufacturing the multilayer printed circuit board according to the present embodiment.
Figure 10B:
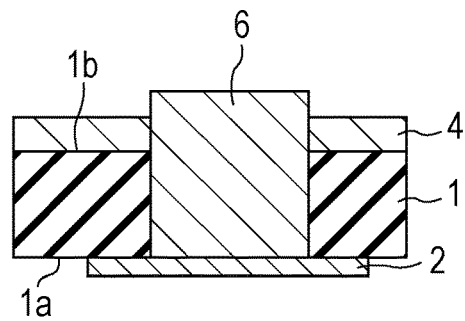

After the unnecessary portion P is removed as described above, as shown in FIGS. 6, 10A and 10B, the protective film 3 and the protective film 7 are peeled off from the wiring substrate 10 (Step S6, peeling step). In FIG. 10A, the protective film 7 is peeled off. In FIG. 10B, the protective film 3 is peeled off.

In the peeling step of the present embodiment, the protective film 3 is peeled after the protective film 7 is peeled.

Note that the protective film 3 and the protective film 7 may be peeled off collectively at once. Thus, the productivity of the multilayer printed circuit board can be improved.

By the peeling step, as shown in FIG. 10B, a part of the conductive paste 6 filling the bottomed via hole 5 protrudes from the adhesive layer 4. An amount of protrusion of the conductive paste 6 is substantially equal to a thickness of the protective film 3.

When the adhesive protective film having the slightly adhesive layer formed on one side thereof is used as the protective film 3, a part of the conductive paste 6 protrudes from the main surface 1b of the insulating resin film 1.

Figure 11A:
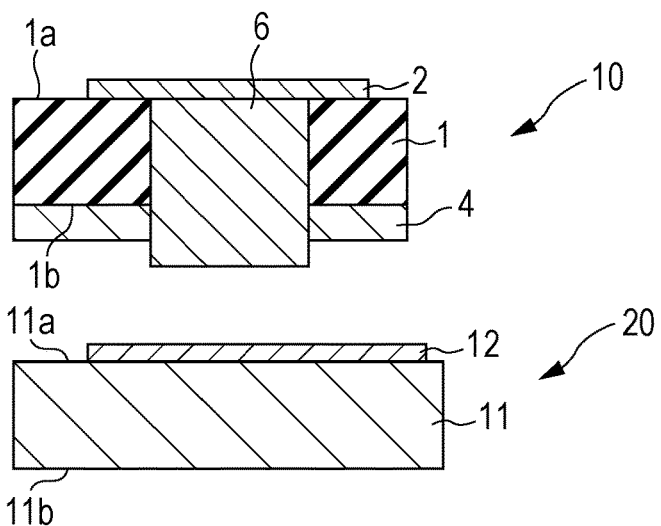
FIGS. 11A and 11B are partial cross-sectional views subsequent to 10A and 10B for explaining the method for manufacturing the multilayer printed circuit board according to the present embodiment.

A wiring substrate 20 (second wiring substrate) is prepared (Step S7). As shown in FIG. 11A, the wiring substrate 20 has an insulating resin film 11 (second insulating resin film) and a circuit pattern 12 (second circuit pattern) formed on the insulating resin film 11. Note that this step may be performed at any timing if it is before a later laminating step.

The insulating resin film 11 is an insulating film made of the liquid crystal polymer (LCP). When the signal transmission rate of the printed circuit board is relatively low, the insulating resin film 11 may contain the known material (polyethylene terephthalate, polyimide or the like) used for the flexible printed circuit board.

As shown in FIG. 11A, the insulating resin film 11 has a main surface 11a (circuit pattern surface) and a main surface 11b opposite to the main surface 11a. In the present embodiment, the insulating resin film 11 includes two films (not shown) bonded to each other. Further, the insulating resin film 11 has a circuit pattern (not shown) sandwiched between the films and a circuit pattern (not shown) formed on the main surface 11b. Note that the insulating resin film 11 may contain only one sheet of film.

The circuit pattern 12 is the wiring layer formed on the main surface 11a of the insulating resin film 11. The circuit pattern 12 is formed by patterning the copper foil in the present embodiment. However, the present disclosure is not limited thereto, but for example, the circuit pattern 12 may be printed with the conductive ink on the main surface 11a.

Figure 11B:
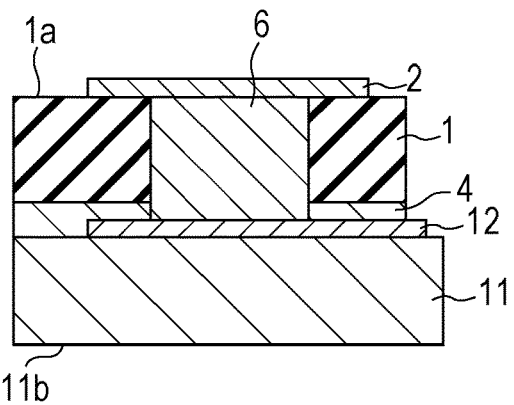

After the wiring substrate 20 is prepared, as shown in FIGS. 11A and 11B, after the protective film 3 and the protective film 7 are peeled off, the wiring substrate 10 is aligned and laminated on the wiring substrate 20 (Step S8, laminating step). More specifically, the wiring substrate 10 is aligned and laminated on the wiring substrate 20 so that the main surface 1b and the main surface 11a face each other, a part of the circuit pattern 12 is exposed, and the conductive paste 6 contacts the circuit pattern 12.

After the wiring substrate 10 is laminated on the wiring substrate 20, the laminated wiring substrate 10 and wiring substrate 20 are integrated by pressing and heating (integration step). By the integration step, the adhesive layer 4 is cured to be a cured adhesive layer 8 bonding the wiring substrate 10 and the wiring substrate 20. Further, the conductive paste 6 becomes a conductive via 9 electrically connecting the circuit pattern 2 and the circuit pattern 12.

In the integration step, the laminated wiring substrate 10 and wiring substrate 20 are heated at a temperature lower than softening temperatures of the insulating resin film 1 and the insulating resin film 11. Thus, it is possible to prevent the insulating resin films 1 and 11 from being melted by heating. As a result, for example, it is possible to prevent an inner layer terminal 12a from being covered by the molten insulating resin film 1.

In the integration step, for example, the laminated wiring substrate 10 and wiring substrate 20 are heated to about 200° C. and pressurized at a pressure of about several MPa, for example, using a vacuum press apparatus or a vacuum lamination apparatus. Note that this temperature is lower by 50° C. or more than the softening temperature of the liquid crystal polymer which is the material of the insulating resin films 1 and 11. The laminated wiring substrates 10 and 20 may be heated at about 150° C. which is about 100° C. lower than the softening temperature of the liquid crystal polymer.

When the vacuum press apparatus is used, the laminated wiring substrate 10 and wiring substrate 20 are, for example, held for about 30 to 60 minutes under the above-described heating and pressing conditions. Thus, thermal curing of the adhesive layer 4 and a binder resin of the conductive paste 6 is completed.

When the vacuum lamination apparatus is used, processing time (heating/pressing time) is about several minutes. Therefore, thermosetting reaction is not yet completed at the end of the process. Therefore, the laminated wiring substrate 10 and wiring substrate 20 are transferred from the vacuum lamination apparatus to an oven apparatus. Then, post-curing process is performed. In the post-curing process, the laminated wiring substrate 10 and wiring substrate 20 are heated, for example, at about 200° C. for about 60 minutes. Thus, the thermal curing of the adhesive layer 4 and the binder resin of the conductive paste 6 is completed.

The metal particles contained in the conductive paste 6 form metal bonds with each other through the above process. At the same time, the metal particles form the alloy layer with the circuit patterns 2 and 12 of copper foil or the like.

As described above, a heating temperature and a post-curing temperature in the integration step are both lower by 50° C. or more (for example, about 100° C.) lower than the melting point of the liquid crystal polymer which is the material of the insulating resin films 1 and 11. Therefore, there is no possibility that the insulating resin film 1 or 11 melts and flows. As a result, according to the present embodiment, the multilayer printed circuit board having the inner layer terminal 12a exposed on the bottom surface of the opening W can be stably manufactured.

After the heat curing of the adhesive layer 4 and the binder resin of the conductive paste 6 is completed, surface treatment of the circuit pattern exposed to the outside, formation of solder resist or the like, and outline processing are performed as necessary.

Figure 12:
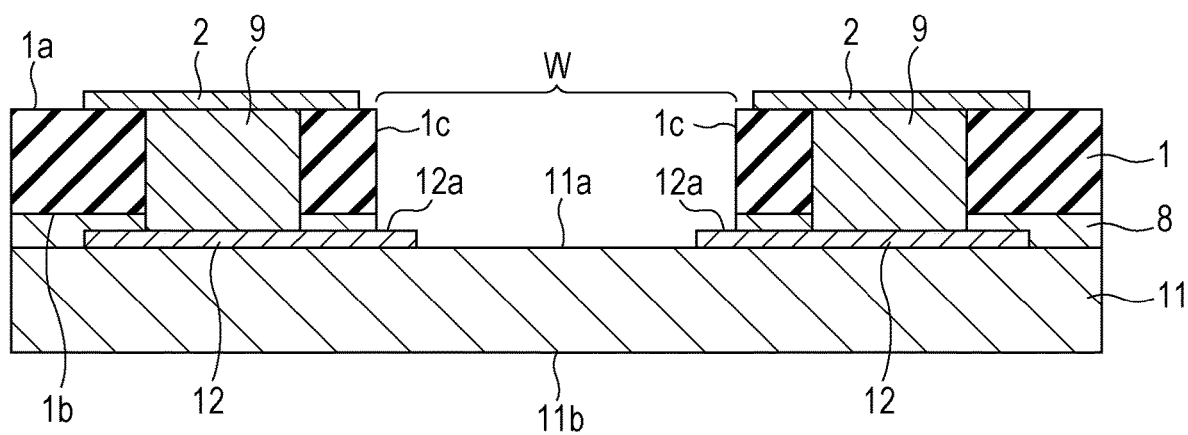
FIG. 12 is a partial cross-sectional view of the multilayer printed circuit board according to the present embodiment.

The multilayer printed circuit board can be obtained through the above steps. FIG. 12 shows a part of the circuit board. The heating temperature in the integration step is lower than the softening temperature of the insulating resin film 1. Therefore, the insulating resin film 1 is not melted. As a result, a shape of a cut surface 1c is maintained during the integration step. Thus, a part of the circuit pattern 12 is not covered by the insulating resin film 1. As a result, the inner layer terminal 12a exposed from the opening W is formed.

In the above manufacturing method, the adhesive layer is formed on the wiring substrate 10 side. However, it is not limited thereto, but the adhesive layer may be formed on the wiring substrate 20 side. In this case, for example, the adhesive protective film having a slightly adhesive layer formed as the protective film 3 on one side thereof is used. Then, in Step S7, the wiring substrate 20 having the adhesive layer (not shown) formed on the main surface 11a is prepared.

Further, in the above manufacturing method, the opening (through-hole) is formed by removing the unnecessary portion by the cutting device. However, formation of the opening is not limited thereto. For example, a length of the wiring substrate 10 may be shorter than the wiring substrate 20 by cutting the wiring substrate 10 in a width direction thereof. Then, the wiring substrate material 10 thus shortened may be laminated on the wiring substrate material 20. In this manner, a part of the circuit pattern 12 can be exposed as the inner layer terminal 12a.

As described above, in the method for manufacturing the multilayer printed circuit board according to the present embodiment, the protective film 7 is disposed to cover the bottomed via hole 5 filled with the conductive paste 6. Thereafter, the unnecessary portion P of the wiring substrate 10 is removed. Therefore, when removing the unnecessary portion P, the conductive paste 6 is not damaged. As a result, the yield of the multilayer printed circuit board can be improved. Further, it is possible to apply the punching by the cutting device such as the blade or the mold to the removal step. As a result, the productivity can be improved as compared to the laser processing or the like.

Therefore, according to the present embodiment, it is possible to manufacture the multilayer printed circuit board having the interlayer connection path formed by the conductive via formed using the conductive paste, and a part of the inner layer circuit pattern exposed to the outside as the inner layer terminal with high yield and high productivity.

<Confirmation of Interlayer Connection Reliability>

A temperature cycle test was performed to evaluate interlayer connection reliability of the multilayer printed circuit board manufactured by the manufacturing method according to the present embodiment. Specifically, during one test, it was changed alternately 200 times between a low temperature state (−55° C. 30 minutes) and a high temperature state (125° C., 30 minutes). Further, for comparison, the temperature cycle test was performed under the same conditions also using the multilayer printed circuit board (not having the inner layer terminal) manufactured by the conventional manufacturing method. As a result, both showed a resistance change rate of 3% or less. From this, it was confirmed that the multilayer printed circuit board manufactured by the manufacturing method according to the present embodiment has the same level of interlayer connection reliability as the multilayer printed circuit board manufactured by the conventional manufacturing method.

<Multilayer Printed Circuit Board>

Here, a structure of the multilayer printed circuit board manufactured by the above manufacturing method will be described in detail with reference to FIG. 12. As shown in FIG. 12, the multilayer printed circuit board according to the present embodiment includes the insulating resin film 1, the circuit pattern 2 formed on the main surface 1a of the insulating resin film 1, the cured adhesive layer 8, the insulating resin film 11, the circuit pattern 12 formed on the main surface 11a of the insulating resin film 11, and the conductive via 9 penetrating the insulating resin film 1 and the cured adhesive layer 8 in the thickness direction and electrically connecting the circuit pattern 2 and the circuit pattern 12.

The insulating resin film 1 is provided with the opening W. The multilayer printed circuit board may have a structure corresponding to the right half (or left half) of FIG. 12.

The insulating resin film 11 has the main surface 11a and the main surface 11b opposite to the main surface 11a. The insulating resin film 11 is laminated on the insulating resin film 1 via the cured adhesive layer 8 so that the main surface 11a faces the main surface 1b. The conductive via 9 is obtained by curing the conductive paste 6 filling the bottomed via hole 5 penetrating the insulating resin film 1 in the thickness direction as described above.

The insulating resin film 1 and the insulating resin film 11 are formed of the liquid crystal polymer. The dielectric loss tangents (tan 5) of the insulating resin film 1, the insulating resin film 11, and the cured adhesive layer 8 are all less than 0.01. A value of the dielectric loss tangent is a value at a frequency of 10 GHz (the same applies hereinafter). More specifically, the dielectric loss tangent of the insulating resin films 1 and 11 is, for example, 0.002 to 0.005. The dielectric loss tangent of the cured adhesive layer 8 is, for example, 0.005.

As shown in FIG. 12, the insulating resin film 1 has the cut surface 1c. The cut surface 1c is an inner wall surface of the opening W in the present embodiment. As described above, the heating temperature of the integration step is sufficiently lower than the softening temperature of the liquid crystal polymer. Therefore, the insulating resin film 1 neither melts nor flows. Therefore, the shape of the cut surface 1c is maintained. Since the shape of the cut surface 1c is maintained in this manner, a part of the circuit pattern 12 is not covered by the insulating resin film 1. As a result, the inner layer terminal 12a exposed on the bottom surface of the opening W is formed.

As described above, in the multilayer printed circuit board according to the present embodiment, the insulating resin films 1 and 1 are formed of the liquid crystal polymer. The circuit pattern 2 and the circuit pattern 12 are electrically connected by the conductive via 9. And the shape of the cut surface 1c of the insulating resin film 1 is maintained. As a result, a part of the circuit pattern 12 of the inner layer is exposed to form the inner layer terminal 12a.

Thus, in the multilayer printed circuit board according to the present embodiment, the insulating base substrate is formed of the liquid crystal polymer.

Therefore, the high-speed signals can be transmitted with low transmission loss. Further, the conductive vias formed using the conductive paste forms the interlayer connection path. Therefore, reliability of the interlayer connection path can be ensured. Furthermore, a part of the circuit pattern of the inner layer is exposed to form the inner layer terminal. Therefore, it is possible to connect the flexible printed circuit board and a mounted component and the like with a high degree of freedom.

Therefore, according to the present embodiment, it is possible to provide the printed circuit board capable of transmitting the high-speed signals with low signal loss, ensuring reliability of the interlayer connection path, and being connected to the electronic component, the printed circuit board or the like with a high degree of freedom.

Based on the above descriptions, those skilled in the art may conceive additional effects or various modifications of the present embodiment. The present embodiments are not limited to the above-described embodiment. Various additions, modifications, and partial deletions can be made without departing from the conceptual idea and spirit of the present embodiments derived from the contents and the equivalents of the present embodiments.

The methods for manufacturing the multilayer printed circuit board according to the embodiments of the present disclosure may be the following first to eleventh method for manufacturing the multilayer printed circuit board.

The first method for manufacturing the multilayer printed circuit board includes: a step of preparing the first wiring substrate having the first insulating resin film having the first main surface and the second main surface opposite to the first main surface, the first circuit pattern formed on the first main surface, and the first protective film releasably bonded to the second main surface: a step of partially removing the first protective film and the first insulating resin film to form the bottomed via hole having the first circuit pattern exposed on the bottom surface; a step of filling the conductive paste into the bottomed via hole: a protection step of disposing the second protective film on the first protective film to cover the bottomed via hole filled with the conductive paste; a removal step of removing an unnecessary portion of the first wiring substrate in which the second protective film is disposed on the first protective film: a peeling step of peeling off the first protective film and the second protective film from the first wiring substrate in which the unnecessary portion is removed; a step of preparing the second wiring substrate having the second insulating resin film having the third main surface and the fourth main surface opposite to the third main surface, and the second circuit pattern formed on the third main surface; and a laminating step of aligning and laminating the first wiring substrate in which the first protective film and the second protective film are peeled off, on the second wiring substrate so that the second main surface and the third main surface face each other, a part of the second circuit pattern is exposed, and the conductive paste contacts the second circuit pattern.

The second method for manufacturing the multilayer printed circuit board is the first method for manufacturing the multilayer printed circuit board, in which the first protective film is releasably bonded to the adhesive layer formed on the second main surface of the first insulating resin film, and in the peeling step, a part of the conductive paste filled into the bottomed via hole protrudes from the adhesive layer by peeling off the first protective film.

The third method for manufacturing the multilayer printed circuit board is the first method for manufacturing the multilayer printed circuit board, in which in the protection step, the second protective film is fixed to the first protective film by using the second protective film not having an adhesive layer at least at a portion contacting the conductive paste.

The fourth method for manufacturing the multilayer printed circuit board is any one of the first to the third methods for manufacturing the multilayer printed circuit board, in which in the removal step, the unnecessary portion is cut and removed with the cutting device applied from the first main surface side.

The fifth method for manufacturing the multilayer printed circuit board is the fourth method for manufacturing the multilayer printed circuit board, in which in the removal step, the first wiring substrate in which the second protective film is fixed to the first protective film is turned upside down so that the first main surface faces upward, the image of the first circuit pattern is recognized using the camera provided above the first wiring substrate, and the alignment between the first wiring substrate and the cutting device is performed based on the image recognition results.

The sixth method for manufacturing the multilayer printed circuit board is any one of the first to the fifth methods for manufacturing the multilayer printed circuit board, in which in the removal step, a region sandwiched between a first conductive via formation region including the filled conductive pastes and a second conductive via formation region including the filled conductive pastes is removed to form an opening penetrating the first wiring substrate in the thickness direction.

The seventh method for manufacturing the multilayer printed circuit board is the sixth method for manufacturing the multilayer printed circuit board, in which the region is removed by punching to form the opening.

The eighth method for manufacturing the multilayer printed circuit board is any one of the first to the seventh methods for manufacturing the multilayer printed circuit board, in which in the peeling step, the first protective film and the second protective film are peeled off together at one time.

The ninth method for manufacturing the multilayer printed circuit board is any one of the first to the eighth methods for manufacturing the multilayer printed circuit board, further including the integration step of integrating the laminated first wiring substrate and second wiring substrate by pressurizing and heating them after the laminating step.

The tenth method for manufacturing the multilayer printed circuit board is the ninth method for manufacturing the multilayer printed circuit board, in which in the integration step, the laminated first wiring substrate and second wiring substrate is heated at a temperature lower than a softening temperature of the first insulating resin film and a softening temperature of the second insulating resin film.

The eleventh method for manufacturing the multilayer printed circuit board is the tenth method for manufacturing the multilayer printed circuit board, in which the first insulating resin film and the second insulating resin film is made of the liquid crystal polymer.

The multilayer printed circuit boards according to the embodiments of the present disclosure may be the following first and second multilayer printed circuit boards.

The first multilayer printed circuit board includes: the first insulating resin film having the first main surface and the second main surface opposite to the first main surface, and made of the liquid crystal polymer; the first circuit pattern formed on the first main surface; the second insulating resin film having the third main surface and the fourth main surface opposite to the third main surface, laminated on the first insulating resin film via the cured adhesive layer so that the third main surface faces the second main surface, and made of a liquid crystal polymer; the second circuit pattern formed on the third main surface of the second insulating resin film; and the conductive via provided to penetrate the first insulating resin film and the cured adhesive layer in the thickness direction and electrically connecting the first circuit pattern and the second circuit pattern, in which the first insulating resin film has the cut surface, and by maintaining the shape of the cut surface, a part of the second circuit pattern is exposed without being covered with the first insulating resin film to constitute the inner layer terminal.

The second multilayer printed circuit board is the first multilayer printed circuit board, in which the cut surface is the inner wall surface of the opening penetrating the first insulating resin film in the thickness direction.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method for manufacturing a multilayer printed circuit board, comprising the following steps:
    S1) preparing a first wiring substrate having a first insulating resin film having a first main surface and a second main surface opposite to the first main surface, a first circuit pattern formed on the first main surface, and a first protective film releasably bonded to the second main surface;
    S2) partially removing the first protective film and the first insulating resin film to form a bottomed via hole having the first circuit pattern exposed on a bottom surface;
    S3) filling the bottomed via hole with a conductive paste;
    S4) disposing a second protective film on the first protective film to cover the bottomed via hole filled with the conductive paste;
    S5) removing an unnecessary portion of the first wiring substrate after the second protective film is disposed on the first protective film;
    S6) peeling off the first protective film and the second protective film from the first wiring substrate after the unnecessary portion is removed;
    S7) preparing a second wiring substrate having a second insulating resin film having a third main surface and a fourth main surface opposite to the third main surface, and a second circuit pattern formed on the third main surface; and
    S8) aligning and laminating the first wiring substrate after the first protective film and the second protective film are peeled off, on the second wiring substrate so that the second main surface and the third main surface face each other, a part of the second circuit pattern is exposed through the removed portion of the unnecessary portion, and the conductive paste contacts the second circuit pattern.

2. The method for manufacturing the multilayer printed circuit board according to claim 1, wherein
    the first protective film is releasably bonded to an adhesive layer formed on the second main surface of the first insulating resin film, and
    in Step S6, a part of the conductive paste filling the bottomed via hole protrudes from the adhesive layer by peeling off the first protective film.

3. The method for manufacturing the multilayer printed circuit board according to claim 1, wherein in Step S4, at least a portion of the second protective film contacting the conductive paste does not have an adhesive layer, and the second protective film is fixed to the first protective film.

4. The method for manufacturing the multilayer printed circuit board according to claim 1, wherein Step S5 includes cutting and removing the unnecessary portion with a cutting device applied from the first main surface side.

5. The method for manufacturing the multilayer printed circuit board according to claim 4, wherein Step S5 comprises:
    turning the first wiring substrate after the second protective film is fixed to the first protective film upside down so that the first main surface faces upward;
    recognizing an image of the first circuit pattern using a camera provided above the first wiring substrate; and
    performing alignment between the first wiring substrate and the cutting device based on recognition results of the image.

6. The method for manufacturing the multilayer printed circuit board according to claim 1, wherein Step S5 comprises:
    removing a region sandwiched between a first conductive via formation region including the bottomed via holes filled with the conductive paste and a second conductive via formation region including the bottomed via holes filled with the conductive paste; and
    thereby forming an opening penetrating the first wiring substrate in a thickness direction thereof.

7. The method for manufacturing the multilayer printed circuit board according to claim 6, wherein Step S5 comprises removing the region sandwiched between the first conductive via formation region and the second conductive via formation region by punching.

8. The method for manufacturing the multilayer printed circuit board according to claim 1, wherein Step S6 comprises peeling off the first protective film and the second protective film together at one time.

9. The method for manufacturing the multilayer printed circuit board according to claim 1, further comprising an integration step of integrating the laminated first wiring substrate and second wiring substrate by pressurizing and heating them after Step S8.

10. The method for manufacturing the multilayer printed circuit board according to claim 9, wherein the integration step comprises heating the laminated first wiring substrate and second wiring substrate at a temperature lower than any of a softening temperature of the first insulating resin film and a softening temperature of the second insulating resin film.

11. The method for manufacturing the multilayer printed circuit board according to claim 10, wherein the first insulating resin film and the second insulating resin film contain a liquid crystal polymer.

* * * * *